(12) United States Patent
Koelsch et al.

(10) Patent No.: US 6,249,117 B1
(45) Date of Patent: Jun. 19, 2001

(54) DEVICE FOR MONITORING AND CALIBRATING OXIDE CHARGE MEASUREMENT EQUIPMENT AND METHOD THEREFOR

(75) Inventors: Ronald G. Koelsch, Roscommon, MI (US); Robert Koelsch, Scottsdale, AZ (US)

(73) Assignee: Wafer Standards, Inc., Tempe, AZ (US)

( * ) Notice: Subject to any disclaimer, the term of this patent is extended or adjusted under 35 U.S.C. 154(b) by 0 days.

(21) Appl. No.: 09/275,154

(22) Filed: Mar. 24, 1999

(51) Int. Cl.[7] ............................. G01R 1/04; H01L 21/31
(52) U.S. Cl. ........................................ 324/158.1; 438/778
(58) Field of Search ............................. 324/158.1, 754, 324/763, 765; 438/424, 778

(56) References Cited

U.S. PATENT DOCUMENTS

| | | |
|---|---|---|
| Re. 29,918 | 2/1979 | Verkuil . |
| 4,319,187 | 3/1982 | Crandall . |
| 4,325,025 | 4/1982 | Corcoran et al. . |
| 4,758,786 | 7/1988 | Hafeman . |
| 4,978,915 | 12/1990 | Andrews, Jr. et al. . |
| 5,216,362 | 6/1993 | Verkuil . |
| 5,498,974 | 3/1996 | Verkuil et al. . |
| 5,594,247 | 1/1997 | Verkuil et al. . |
| 5,767,693 | 6/1998 | Verkuil . |
| 5,834,941 | * 11/1998 | Verkuil ................................ 324/753 |

* cited by examiner

Primary Examiner—Safet Metjahic
Assistant Examiner—J. Kerveros
(74) Attorney, Agent, or Firm—Weiss & Moy, P.C.; Jeffrey D. Moy; Jeffrey Weiss

(57) ABSTRACT

A stabilized wafer for monitoring and calibrating oxide charge test equipment. The stabilized wafer comprises; a silicon wafer, a $SiO_2$ layer of at least 100 angstroms upon the silicon wafer, and a phosphosilicate glass layer containing phosphorus formed in the $SiO_2$ layer for providing the stabilized wafer by stabilizing an $SiO_2$ interface and containing oxygen ions. The stabilized wafer is used for monitoring and calibrating oxide charge test equipment.

5 Claims, 2 Drawing Sheets

DEVICE FOR MONITORING AND CALIBRATING OXIDE CHARGE MEASUREMENT EQUIPMENT AND METHOD THEREFOR

FIELD OF THE INVENTION

This invention is in the field of semiconductor fabrication process monitoring and control, and methods therefor, and more particularly, is a device and method that applies to the calibration, monitoring and control of test equipment used on the process line to measure oxide charge including mobile ion contamination.

DESCRIPTION OF THE RELATED ART

Semiconductor wafers undergo a variety of measurements to measure and ensure the suitability of the wafer for further processing. Some of these measurements test for acceptable levels of charge time retention, dopant concentration, leakage and mobile ion concentration. In particular, one of these tests, for the detection of mobile ion concentration and other oxide charge is key to the successful fabrication of integrated circuits upon semiconductor wafers in the process line. The monitoring of mobile ion contaminants such as sodium ions or potassium ions is required to ensure that adequate yields result, and also to ensure that the reliability of the products is maintained at a quality level. Mobile ions are most commonly caused by the atoms of contaminant, or impure, materials. Two examples of major sources of contaminants are sodium and potassium. Sodium may be introduced from quartz ware within oxide furnaces, and it may also be present in chemicals used during the semiconductor manufacturing process such as photoresist solutions. These contaminant ions are of course differentiated from implanted dopant ions such as boron and phosphorus.

In general there are two methods that are routinely used to test for oxide charge, including mobile ion contamination. The first of these methods measures the capacitance-voltage (CV) of metal-oxide-silicon (MOS) structures. The second method measures surface photovoltage (SPV) and oxide surface voltage (Vs) without using a metal contact, and in some cases measures the amount of charge deposited on top of the oxide by a corona-discharge source.

The first measurement method utilizes equipment that is categorized as a contact probe tester to measure the CV. A contact probe tester method utilizes a process in which a voltage is incremented on a MOS electrode upon the surface of a semiconductor wafer using a contact probe, and the corresponding increment in the charge upon the wafer, as measured by a contact probe coulombmeter is monitored.

The second measurement method utilizes equipment that is categorized as a non-contact probe tester. In the non-contact probe tester method a corona gun or wire is used to deposit charges on the dielectric for biasing it. An example of a non-contact probe tester is given in U.S. Pat. No. 5,498,974, and functions as follows: A wafer is charged with a non-contact corona discharge at a positive polarity until a positive dielectric field is developed. A negative, though equal in value, polarity is then applied to the wafer until a negative dielectric field is developed. The amount of corona discharge necessary to change the dielectric field from the positive field to the negative field is measured. This measured charge, $Q_m$ is noted. Next, an ideal amount of corona discharge necessary to change the dielectric field voltage of a dielectric layer of known thickness from a specific positive dielectric field to a negative, though equal in value, dielectric field is then applied to the wafer. The resultant ideal charge, $Q_i$, is then observed. The ideal charge $Q_i$ is then compared to the measured charge $Q_m$. The difference between the measured ideal charge $Q_i$ and measured charge $Q_m$ is directly proportional to the amount of mobile ions in the dielectric layer.

There is however, a major area of concern with mobile ion measurement equipment and methods. In order to assure that the readings and measurements obtained by the mobile ion measurement equipment and methods are of high quality, the equipment and methods must be calibrated and verified. There is currently only one common method used for the calibration of mobile ion measurement equipment, and this method is incapable of meeting accepted quality control standards, such as ISO 9000, (International Organization for Standardization (ISO)—Quality management and quality standards assurance. (9000 series)) This method of calibration consists of the production of calibration wafers that have been intentionally contaminated with mobile ions. While the production of calibration wafers, or wafer standards as they are sometimes known, is desirable, these calibration wafers are difficult to produce because the dielectrics of a wafer that have been purposely contaminated with mobile ions tend to be unpredictable and unstable in their use. The unpredictability and instability of the calibration wafers can result in the incorrect calibration of the oxide charge measurement equipment. This may then lead to incorrect assessments of the production line equipment and the wafers in process, which in turn leads to faulty or imperfectly operating semiconductor devices.

A further problem is that in order to control the oxide charge in a semiconductor fabrication line, it is necessary to distinguish between the variables associated with the dielectric layer of a wafer under test and the variables in the tester itself.

Therefore, a need existed for a system and method of producing improved calibration wafers. An additional need existed for a system and method of producing calibration wafers having the properties of predictability and stability in order to ensure the correct assessment of the production line equipment and the wafers in process. A further need existed for a system and method of producing high quality calibration wafers capable of meeting quality control certification. Yet a further need existed for a system and method of producing high quality calibration wafers to enable distinguishing between the variables associated with the dielectric layer of a wafer under test and the variables in the tester itself.

SUMMARY OF THE INVENTION

An object of the present invention is to provide a system and method of producing improved calibration wafers.

Another object of the present invention is to provide a system and method of producing calibration wafers having the properties of predictability and stability in order to ensure the correct assessment of the production line equipment and the wafers in process.

A further object of the present invention is to provide a system and method of producing high quality calibration wafers capable of meeting quality control certification.

An additional object of the present invention is to provide a system and method of producing high quality calibration wafers to enable distinguishing between the variables associated with the dielectric layer of a wafer under test and the variables in the tester itself.

BRIEF DESCRIPTION OF THE PREFERRED EMBODIMENTS

In accordance with a preferred embodiment of the present invention a stabilized wafer for monitoring and calibrating oxide charge test equipment is disclosed. The stabilized wafer for monitoring and calibrating oxide charge test equipment comprises; a silicon wafer, a $SiO_2$ layer upon the silicon wafer, and a phosphosilicate glass layer formed in the $SiO_2$ layer for providing the stabilized wafer by stabilizing an $SiO_2$ interface and containing oxygen ions.

In accordance with another embodiment of the present invention a method of constructing and using a stabilized wafer for monitoring and calibrating oxide charge test equipment is disclosed. The method of constructing and using a stabilized wafer for monitoring and calibrating oxide charge test equipment comprises the steps of; providing a stabilized wafer for stabilizing an $SiO_2$ interface and containing oxygen ions, and using the stabilized wafer for monitoring and calibrating oxide charge test equipment.

In accordance with yet another embodiment of the present invention a method of constructing and using a stabilized wafer for monitoring and calibrating oxide charge test equipment is disclosed. The method of constructing and using a stabilized wafer for monitoring and calibrating oxide charge test equipment comprises the steps of; providing a silicon wafer, placing a polarizable dielectric layer of $SiO_2$ on the silicon wafer for stabilizing an $SiO_2$ interface and containing oxygen ions, forming a phosphosilicate glass layer in the top of the $SiO_2$ layer, and annealing the silicon wafer.

DESCRIPTION OF THE PREFERRED EMBODIMENTS

Figure 1:
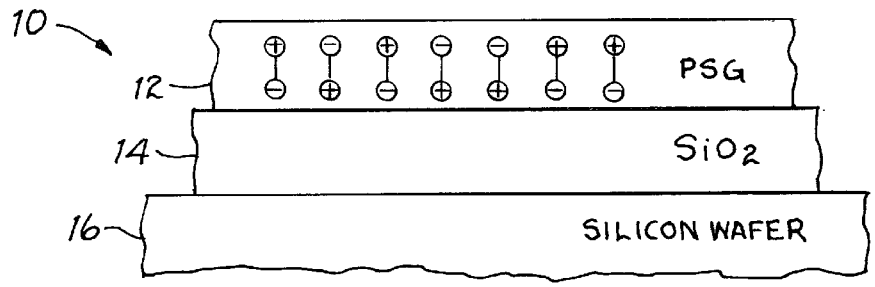
FIG. 1 is a schematic drawing of the device used to monitor and calibrate oxide charge testers according to the invention.

When using either of the two oxide charge measurement methods, contact or non-contact, it is necessary to monitor and calibrate both the contact and non-contact probe testers. The present invention is applicable in the fields of both contact and non-contact probe testers and methods of testing for oxide charge, including mobile ion contamination. In a preferred embodiment, it is especially useful for the monitoring and calibration of non-contact probe testers such as the non-contact probe described in U.S. Pat. No. 5,498,974.

A wafer standard of the present invention is constructed from a silicon wafer with a silicon dioxide ($SiO_2$) layer and a layer of phosphosilicate glass (PSG), and is used for the monitoring and calibration of the mobile ion contact and non-contact probe testers. The polarization properties of the PSG simulate mobile ions in the $SiO_2$ by causing a shift in the surface potential of the $SiO_2$ dielectric after temperature and bias are applied. This phenomena is stable and repeatable making it ideal for mobile ion probe tester calibration and monitoring.

Mobile ion probe tester calibrators in the form of wafer standards are desirable but difficult to build because dielectrics that have been purposely contaminated with mobile ions tend to be unpredictable and unstable. The use of a phosphosilicate (PSG) glass layer solves this problem because its polarization properties result in desirable qualities of such as the charge drift that has been placed in the wafer is reversible from one polarity to the opposite polarity. Additionally, the wafer charge drift will saturate at a certain level, and then maintain at that level, for a given stressing electric field, time and temperature. And furthermore, the wafer's PSG layer has the effect of passivating the $SiO_2$, thus preventing the Si—$SiO_2$, interface charge of the grown oxide from shifting and thereby locks in the overall charge characteristics of the final $SiO_2$/PSG composite dielectric. Therefore, the PSG wafer of the present invention has desirable properties of repeatability and stability.

These desirable properties are particularly interesting in that PSG was once examined for use in stabilizing field effect transistor (FET) gate oxides, but its use was rejected as the polarization effect caused too much threshold voltage (Vt) shift in that application. However, in a preferred embodiment of the present invention, that same property of polarization has been found to be particularly useful for the simulation of mobile ions to result in predictable and stable wafer standards.

PSG film compositions in $SiO_2$ can be formed by a number of processes. An exemplary method of producing PSG film compositions in $SiO_2$ is by alloying thermally grown $SiO_2$ with phosphorus pentoxide ($P_2O_5$) vapor followed by a nitrogen anneal. The $P_2O_5$ vapor may be from either, a solid $P_2O_5$ source, a liquid $POCl_3$ source, a spin-on-glass phosphorus source, or a phosphorus doped CVD—$SiO_2$ source.

Another exemplary method of producing PSG film compositions in $SiO_2$ is by ion implantation of phosphorus followed by an oxygen anneal.

The wafer standard of the present invention is suitable for both contact and non-contact probe testers. If the desired use of the wafer standard is with a contact probe tester, a further addition to a preferred embodiment may be the addition of a MOS structure. A MOS structure is formed by processing metal contacts on top of the composite dielectric. Additionally, some contact probe testers are designed to measure dielectric properties of wafers without the need of metal contacts, and these contact probe testers may be used with the wafer standard that either do, or do not, have MOS structure metal contacts.

If the present invention is desired to be used with non-contact probe testers, a corona gun or wire is used to deposit a charge upon the wafer standard in a controlled fashion. The combination of the electric field created across the dielectric by this deposited charge and the heating of the wafer standard from the wafer chuck heating, will stress the PSG layer electrically and thermally, causing it to polarize. A Kelvin probe, a Monroe probe or their equivalent is used to measure the potential of the dielectric surface before and after stressing. The shift in dielectric surface potential is quantified to simulate mobile ion drift ($Q_m$) in $SiO_2$.

The applicable measurements of the properties of the wafer standard device formed by the composite dielectric and silicon wafer are obtained by simply using the non-contact probe tester to determine the SPV, Vs and corona charge deposited on top of the dielectric.

An Additional advantage and feature of the wafer standard of the present invention in a preferred embodiment includes that since the PSG stabilizes all charges in the $SiO_2$, the measurement of leakage, threshold voltage (Vt), equivalent charge (Qeff), total charge (Qtot), density of interface traps (Dit), density of oxide traps (Dot), flatband voltage (Vfb), dielectric thickness (Tox) and surface photovoltage (SPV) becomes repeatable day in and day out over months of time. Additionally, the wafer standard becomes the means to measure and control the variables in a probe tester including the variables having their origins in electrical, mechanical, thermal or computer software components. Furthermore, a wafer standard, in a preferred embodiment of the present invention, may be used to monitor, calibrate and troubleshoot oxide charge testers and correlate it with other testers.

Construction

Referring first to FIG. 1, the wafer standard device 10 for calibrating mobile ion probe testers, or oxide charge testers is shown. The wafer standard device 10, in a preferred embodiment, is a silicon wafer 16 with a polarizable dielectric layer. The dielectric may be $SiO_2$ 14 with a PSG 12 layer on the top. In that case, in a preferred embodiment, the $SiO_2$ 14 is thermally grown to a thickness of approximately 500 to 700 angstroms and the PSG 12 is formed by either diffusing or ion implanting phosphorus into the $SiO_2$ 14. However, special cases might use $SiO_2$ 14 thermally grown to a thickness as thin as about 100 angstroms and as thick as about 1500 angstroms. An appropriate anneal is done to complete the wafer standard device 10.

The anneal must minimize $Si-SiO_2$ interface charge and assure the formation of the $P_2O_5$ molecule. In a preferred embodiment, When implanting phosphorus, an oxygen anneal between about 700° C. to about 1000° C. is used to incorporate oxygen into the process so that $P_2O_5$ is formed, though in a preferred embodiment, a temperature range of about 900° C. to about 1000° C. is used for the oxygen anneal.

When diffusion is used, a nitrogen anneal in the same temperature range(s) as that used for the oxygen anneal is sufficient because the oxygen is available to form $P_2O_5$ during the POCL3 deposition. PSG 12 is thus formed by alloying $SiO_2$ 14 with $P_2O_5$. The PSG 12 serves to ensure that movement of ions such as oxygen are contained within the PSG 12. Furthermore, the PSG 12 protects and stabilizes the $SiO_2$ 14 interface.

The structure of the $SiO_2$ 14 is composed of interconnected tetrahedra of $SiO_4$. Alloying $SiO_2$ 14 with $P_2O_5$ to form PSG 12 incorporates tetrahedra of $PO_4$ into the network of $SiO_2$ 14. The non-bridging oxygen ion associated with every other phosphorus ion results in a loosely bound oxygen ion that transfers between neighboring $PO_4$ tetrahedra under the influence of an applied electric field. The mobility of the oxygen ion results in the electrical polarization of the PSG 12. The mobile ions stay inside the PSG 12 layer.

This is in contrast to the general case $SiO_2$ 14 contaminated with mobile sodium ions when there is no PSG 12 to protect the $SiO_2$ 14. In this case the sodium is free to move throughout the $SiO_2$ 14 in a random and unpredictable manner. This containment of the mobile oxygen ions in the PSG 12 layer explains why $SiO_2$ 14 with PSG 12 produces a much more repeatable mobile ion measurement on the tester.

The negative oxygen ions also act to getter oxide contaminates such as mobile positive ions like sodium that weaken and destabilize the $SiO_2$ 14. This beneficial effect of the PSG 12 layer accounts for the repeatability of the mobile ion measurement day in day out over months of testing.

Furthermore, the PSG 12 formation generally coincides with a liquidus phase. The resulting continuous glass layer over the oxide accounts for an increase in the dielectric strength of the $PSG/SiO_2$ composite compared to $SiO_2$ alone and greatly reduces flaw-type failures. Another beneficial effect of the continuous glass layer formed by the PSG 12 is to stabilize the overall charge characteristics of the capacitor formed by the $Si-SiO_2$-PSG, assuring the repeatability of interface and bulk charge measurements such as: leakage, Vt, Vfb, Qeff, Tox, Dit, Dot, Qtot, spv tests etc. The result is a wafer standard device 10 ideal for use as a wafer standard for oxide charge testers.

Before use of the wafer standard device 10 for testing of oxide testers, the dipoles of the PSG 12 may be randomly disordered in some initial state. To get a consistent mobile ion measurement, the dipoles should be pre-aligned at the beginning of the calibration method to bring them to an orderly initial state. This can be accomplished by letting the dipoles come to equilibrium at room temperature before testing of oxide testers or by defining some other initial state by pre-aligning the dipoles in the PSG 12 layer.

Figure 2:
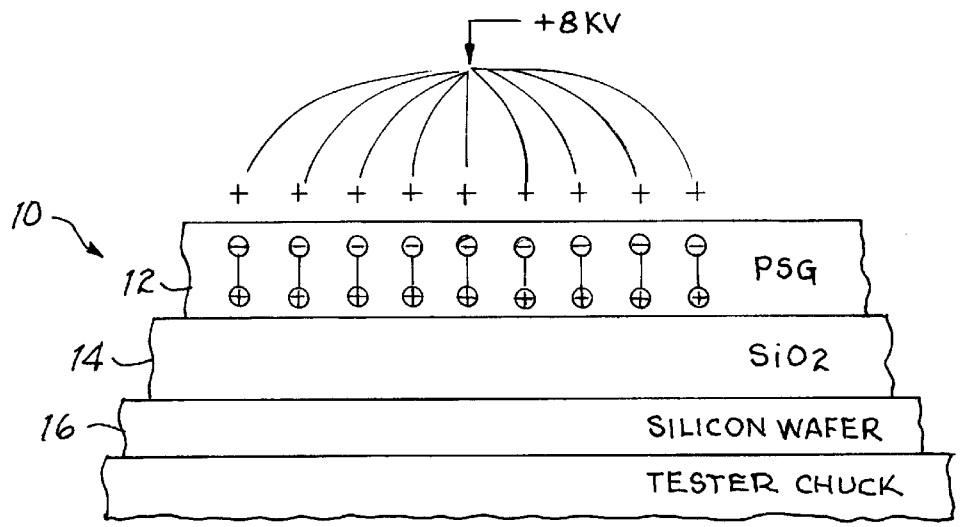
FIG. 2 is a schematic drawing of the device after polarization of the PSG layer from an applied electric field and temperature-bias stressing.
Figure 3:
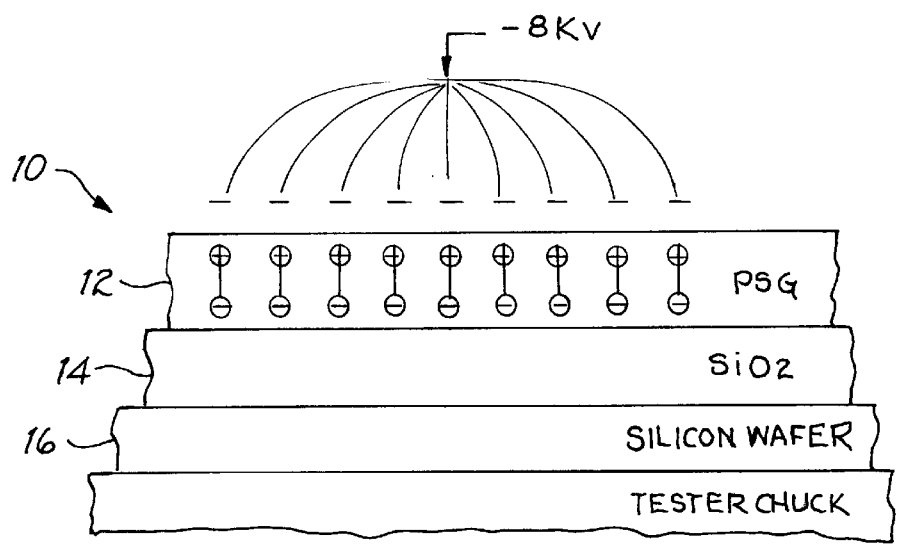
FIG. 3 is a schematic drawing of the device after reversal of the temperature-bias stressing of FIG. 2.

Referring to FIG. 2, the method for calibrating the wafer standard device 10 begins by aligning the dipoles of the polarization layer, PSG 12, in the same direction. For a PSG 12 layer, this is best accomplished by thermal stressing using a negative corona bias for p-type wafers and positive corona bias for n-type wafers. After pre-alignment the normal mobile ion test routine is carried out which usually consists of a "push" using positive bias followed by multiple "pulls" using negative bias (see FIG. 3) to get full dipole reversal and a consistent mobile ion measurement. The present embodiment shows the use of plus and minus 8 kilovolts for this procedure of push (FIG. 2) and pull (FIG. 3). The actual voltage used for this procedure may vary however in accordance with the equipment or platform that the wafer standard device 10 of the present invention is being used with.

Testing non-mobile ion oxide parameters such as leakage, Vt, Vfb, Qeff, Dit, Dot, Qtot, spv, etc. is best done when the PSG 12 layer polarization is in the initial state of choice, be it equilibrium or pre-alignment. This assures repeatable measurements that are not skewed by an unknown charge distribution within the PSG 12 layer due to random polarization.

Figure 4:
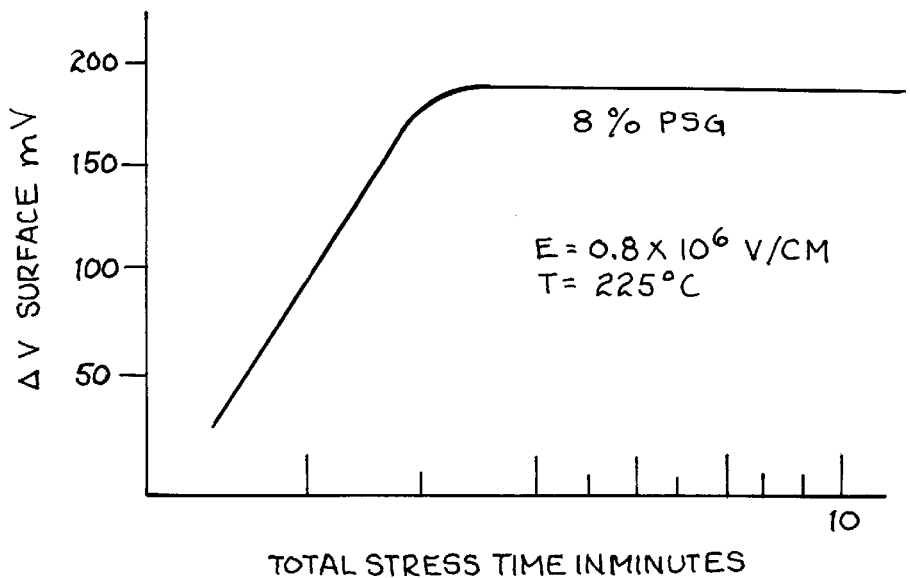
FIG. 4 is an exemplary graph of the change in surface potential of the composite dielectric during temperature-bias stressing.

Referring to FIG. 4, a typical PSG composition, temperature-bias stress condition and related surface voltage shift as a function of time are shown. The PSG concentration in the $SiO_2$ is between one and fifteen mole percent. The concentration of PSG is controlled by the time, temperature and parts per million (ppm) of the $P_2O_5$ diffusion. For ion implantation, it is the dose and energy of the phosphorus ion implantation that sets the concentration. The final concentration of the PSG is measured by Secondary Ion Mass Spectroscopy (SIMS), or by the etch rate of the PSG in a dilute HF bath. Thermal stress conditions may vary by species of dipoles and type of dielectric. Typical stress temperatures for PSG in $SiO_2$ range from 170° C. to 280° C. and typical biasing electric fields vary from $0.5 \times 10^6$ volts per centimeter to $2.5 \times 10^6$ volts per centimeter. This combination of thermal stress conditions gives a flatband voltage shift of between 30 millivolts and 250 millivolts for a dielectric thickness from 500 angstroms to 1000 angstroms. This corresponds to mobile ion concentrations of from $0.5 \times 10^{10}$ ions per square centimeter to $20 \times 10^{10}$ ions per square centimeter.

Figure 5:
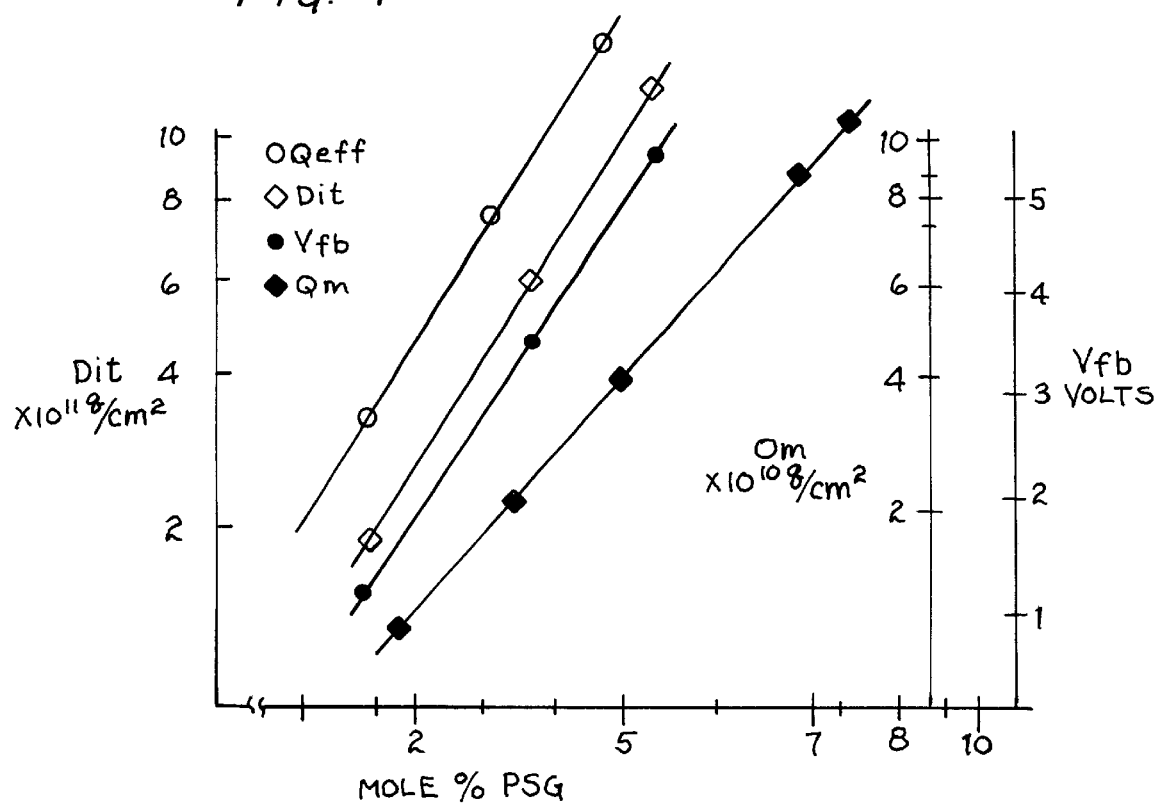
FIG. 5 is an exemplary graph of the change in oxide charge parameters as a function of the PSG concentration.

FIG. 5 shows the change in various oxide charges as the concentration of PSG changes. The wafer standard device 10 (FIGS. 1–3) can be fabricated to give the end user the quantity of charge desired for a particular application. In the instance of Qm, for example, if $4 \times 10^{10}$ mobile ions per square centimeter are desired, the PSG concentration would be 5 mole %. Similarly, for a Qeff of $4 \times 10^{11}$ charges per square centimeter the PSG concentration would be 2 mole %.

Although the invention has been particularly shown and described with reference to a preferred embodiment thereof, it will be understood by those skilled in the art that changes in form and detail may be made therein without departing from the spirit and scope of the invention.

What is claimed is:

1. A stabilized wafer for monitoring and calibrating oxide charge test equipment, comprising in combination: a silicon wafer;

a SiO2 layer upon said silicon wafer;

a polarizable phosphosilicate glass layer containing mobile oxygen ions formed in said SiO2 layer for providing said stabilized wafer by stabilizing an SiO2 interface;

wherein said polarizable phosphosilicate glass layer further comprises phosphorus; and a $P_2O_5$ molecular layer resulting from annealing said polarizable phosphosilicate glass layer in a temperature range of about 700° C. to about 1000° C.

2. The stabilized wafer of claim 1 wherein said phosophorus comprises gas diffused phosophorus.

3. The stabilized wafer of claim 1 wherein said phosphorus comprises ion implanted phosphorus.

4. The stabilized wafer of claim 1 wherein said $SiO_2$ layer has a thickness of at least 100 angstroms.

5. The stabilized wafer of claim 1 further comprising MOS metal contacts formed on said phosphosilicate glass layer.

* * * * *